United States Patent [19]

Nagano

[11] 4,333,141

[45] Jun. 1, 1982

[54] FULL WAVE RECTIFIER

[75] Inventor: Katsumi Nagano, Hiratsukashi, Japan

[73] Assignee: Tokyo Shibaura Denki Kabushiki Kaisha, Kawasaki, Japan

[21] Appl. No.: 188,662

[22] Filed: Sep. 19, 1980

[30] Foreign Application Priority Data

Sep. 25, 1979 [JP] Japan .................... 54-122074

[51] Int. Cl.³ .......................................... H02M 7/217
[52] U.S. Cl. ................................................ 363/127
[58] Field of Search .................................... 363/127

[56] References Cited

U.S. PATENT DOCUMENTS 3,787,755 1/1974 Goldner ............................ 363/127
3,958,170 5/1976 Hodgson ........................... 363/127

Primary Examiner—William M. Shoop
Attorney, Agent, or Firm—Cushman, Darby & Cushman

[57] ABSTRACT

A full wave rectifier includes an operational amplifier having an inverting terminal connected to the emitter of a transistor. A first resistor is connected between a first power source and the collector of the transistor. A second resistor is connected between a second power source and the emitter of the transistor. When the first and second resistors have an identical value and first and second power sources have same absolute voltage but opposite polarity, the voltage on the transistor collector represents the rectification of the voltage applied to the non-inverting input of the operational amplifier.

3 Claims, 8 Drawing Figures

FULL WAVE RECTIFIER

BACKGROUND OF THE INVENTION

This invention relates to a full wave rectifier and more particularly, to one that exhibits a high degree of accuracy and is capable of rectifying low input voltages.

Many circuits employ diodes to rectify signals. However, the forward voltage drop associated with a diode limits its ability to rectify low level signals. The combination of a diode with an operational amplifier results in a circuit with a much lower threshold. One example of such a combination is called a full wave precision rectifier which uses a diode-bridge circuit and provides a current source drive for a floating load such as a D'ArsonVal meter movement (FIG. 1). However, the accuracy of rectification is not satisfactory because of the diode-bridge circuit.

SUMMARY OF THE INVENTION

The present invention provides accurate full wave rectification even for low input signals. In the present invention, an operational amplifier has an inverting terminal connected to the emitter of a transistor and an output to which the transistor base is responsive. A first resistor is connected between a first power source and the collector of the resistor. A second resistor is connected between a second power source and the emitter of the transistor. When the first and second resistors have an identical value and the first and second power sources have the same absolute voltage, but opposite polarity, the voltage on the transistor collector represents the rectified input voltage.

BRIEF DESCRIPTION OF THE DRAWINGS

This invention can be more fully understood from the following detailed description when taken in conjunction with the accompanying drawings, in which.

DETAILED DESCRIPTION OF THE PREFERRED EMBODIMENTS

Figure 1:
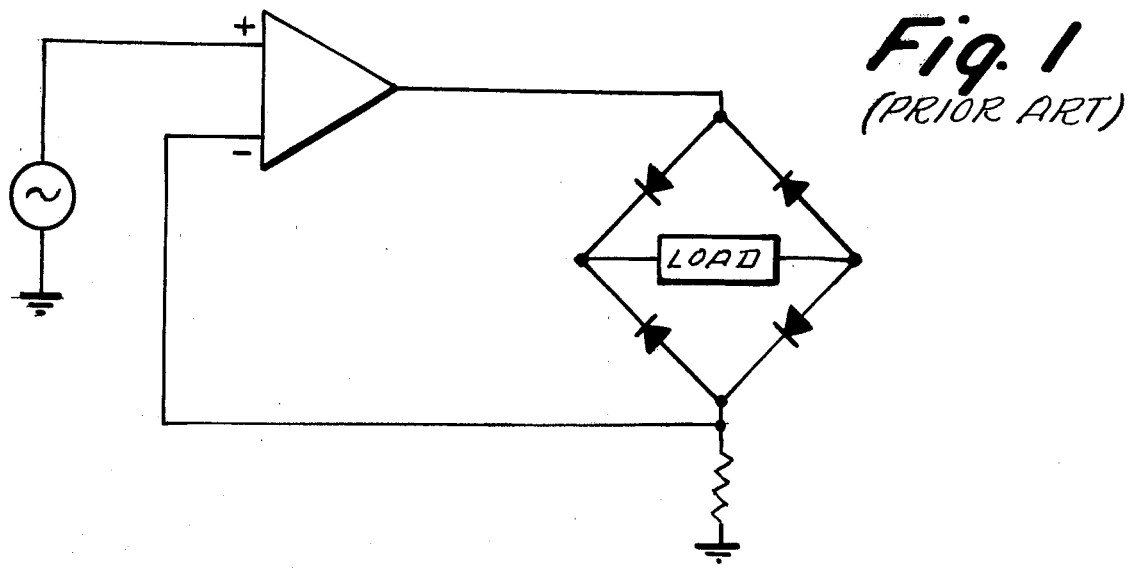
FIG. 1 shows a conventional full wave rectifier using a diode-bridge circuit.
Figure 2:
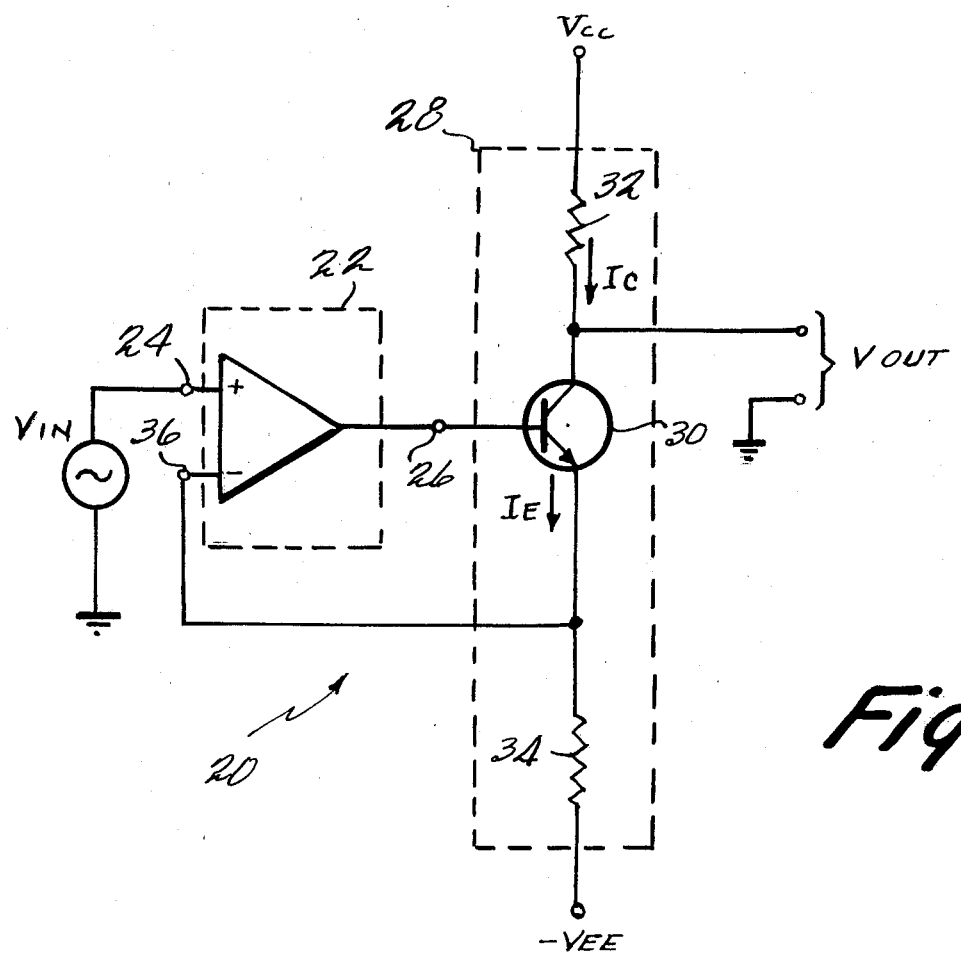
FIG. 2 shows a full wave rectifier circuit according to the present invention.

FIG. 2 shows a full wave rectifier 20 according to the present invention which includes an operational amplifier 22. Input $V_{in}$ is applied to a non-inverting terminal 24. An output of operational amplifier 22 is delivered from a terminal 26, which is connected to a transistor circuit 28 including an n-p-n transistor 30, and first and second resistors 32 and 34. Resistor 32 is connected between a first power source $V_{CC}$ and transistor 30, specifically the collector thereof. A second resistor 34 is connected between a second power source $-V_{EE}$ and transistor 30, specifically the emitter thereof. The emitter of transistor 30 is connected to an inverting terminal 36 of operational amplifier 22. Connection of the emitter of transistor 30 to inverting terminal 36 forms a negative feedback loop, and it causes the emitter voltage $V_E$ of transistor 30 to follow the input. Namely, operational amplifier 22 works as a comparator, which compares the input signal $V_{in}$ with the emitter voltage $V_E$. The output signal $V_{out}$ of rectifier 20 is delivered the collector of transistor 30.

The full wave rectifying characteristics of this circuit are described below.

Figure 4:
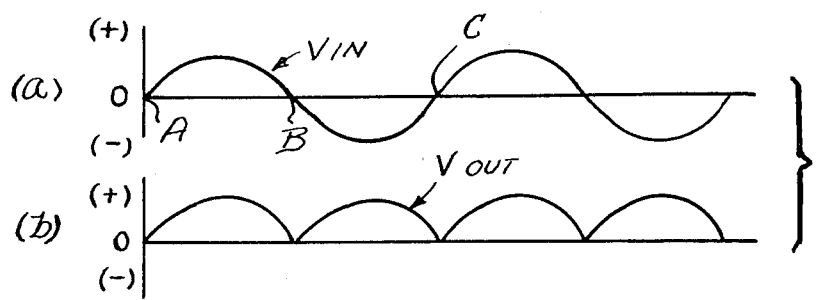
FIG. 4 shows the input signal and output signal of the circuit shown in FIG. 3.

Consideration of the collector emitter voltage $V_{CE}$ when $V_{in}>0$, such as between A and B in FIG. 4, indicates that transistor 30 operates in a saturated state because the collector-emitter voltage $V_{CE}$ never takes a negative value as long as the emitter current $I_E$ flows. In saturation, $V_{BE}$ for transistor 30 is small and $V_{CE}$ is even smaller. Thus the voltage on the collector of transistor 30 is the same as the voltage on the base of transistor 30 except for a small DC offset. As a result of the feedback arrangement with amplifier 22, the voltage at terminal 26 tracks $V_{in}$ at terminal 24. Thus $V_{out}=V_{in}$ when $V_{in}>0$.

When input $V_{in}$ is negative, such as between B and C in FIG. 4, emitter current $I_E$ flowing in the emitter is expressed by the following equation:

$$I_E=(V_E-(-V_{EE}))/R_{34} \qquad (1)$$

where $R_{34}$ is the value of second resistor 34.

Equation (1) may be modified as follows, because the emitter voltage $V_E$ of transistor 30 follows the input $V_{in}$:

$$I_E=(V_{in}+V_{EE})/R_{34} \qquad (2)$$

If the emitter current $I_E$ is assumed to be equal to the collector current $I_C$ of transistor 30, output $V_{out}$ is given by the following equation:

$$V_{out}=V_{CC}-R_{32}(V_{in}+V_{EE})/R_{34} \qquad (3)$$

where $R_{32}$ is the value of first resistor 32.

If resistors 32 and 34 are identical ($R_{32}=R_{34}$) and the voltages of power sources $V_{cc}$ and $-V_{EE}$ have equal absolute value ($|V_{CC}|=|-V_{EE}|$), equation (3) may be rewritten as follows:

$$V_{out}=-V_{in} \qquad (4)$$

when $V_{in}<0$.

As the collector-emitter voltage $V_{CE}$ has a positive value, equation (4) is valid when the input is in a negative half cycle.

Accordingly, the output $V_{out}$ of rectifier 20 has an absolute value of the input and is expressed as follows:

$$V_{out}=|V_{in}| \qquad (5)$$

A wave form of the output is shown in FIG. 4(b).

Equation (2) is obtained under the assumption that the emitter current $I_E$ is equal to the collector current $I_C$. However, a more accurate equation is as follows:

$$V_{out}=V_{CC}-\alpha R_{32}(V_{in}+V_{EE})/R_{34} \qquad (6)$$

where α is the current amplification factor of transistor 30 when its base is grounded.

Equation (6) may be rewritten when resistors 32 and 34 are identical and the absolute value of each power sources $V_{CE}$ and $-V_{EE}$ is the same as follows:

$$V_{out} = V_{CC} - \alpha (V_{in} + V_{EE}) \quad (7)$$

$$= -\alpha V_{in} + (1 - \alpha)V_{CC} \quad (8)$$

According to equation (8), deviation between input $V_{in}$ and output $V_{out}$ mainly depends on the current amplification factor.

When the input signal is positive, deviation between $V_{in}$ and $V_{out}$ is caused by the saturated collector-emitter voltage $V_{CE\,sat}$. This deviation is more significant when the amplitude of input $V_{in}$ is small. Saturated collector-emitter voltage $V_{CE\,sat}$ is about 100 mV at 1 mA of collector current $I_C$ when rectifier 20 is in the form of an integrated circuit.

Figure 3:
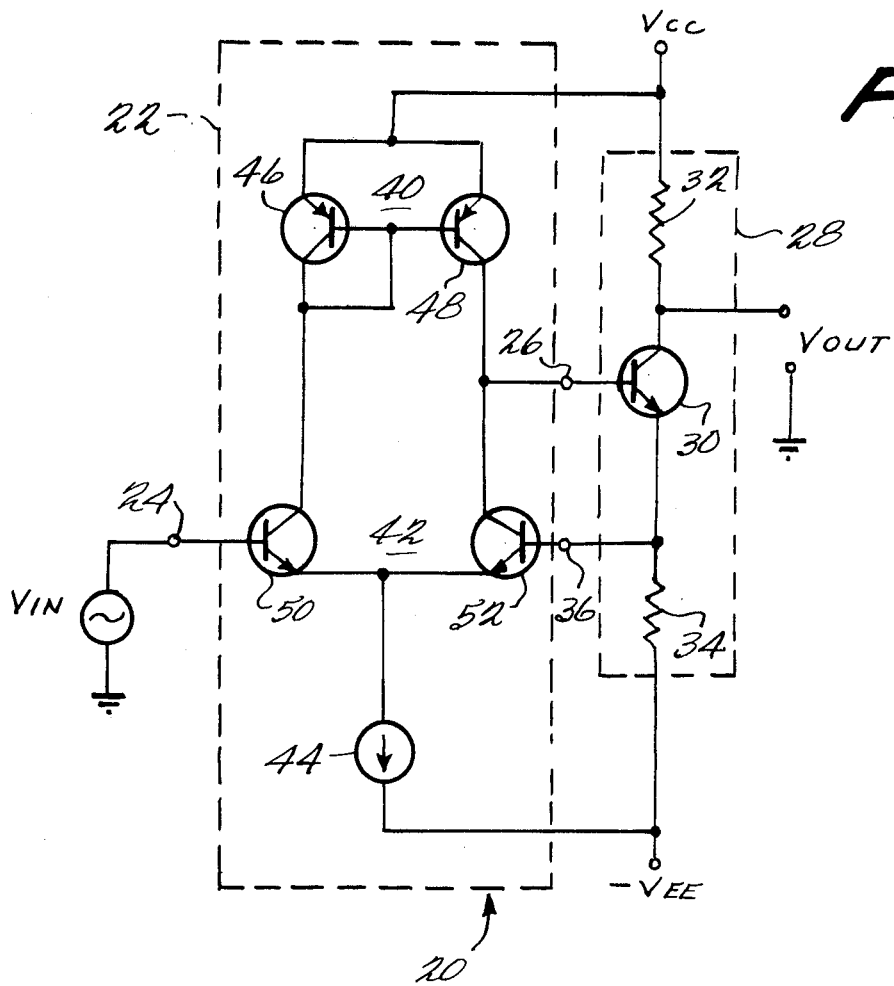
FIG. 3 shows a more detailed diagram of the circuit of FIG. 2.

FIG. 3 is a detailed circuit diagram of rectifier 20 illustrating the circuitry of amplifier 22. Operational amplifier 22 has a current mirror 40, a differential transistor pair 42 and a constant current source 44. Current mirror 40 consists of a pair of p-n-p transistors 46 and 48. The emitters of transistors 46 and 48 are connected to first power source $V_{CC}$. Transistor 46 operates as a diode in that its base and collector are interconnected. The bases of transistors 46 and 48 are connected to each other.

Differential pair 42 includes a pair of n-p-n transistors 50 and 52. The collectors of transistors 50 and 52 are connected to the collectors of transistors 46 and 48, respectively.

Constant current source 44 is provided between second power source $-V_{EE}$ and the emitters of transistors 50 and 52.

Non-inverting terminal 24 of operational amplifier 20 is connected to the base of transistor 50, while output terminal 26 of amplifier 22 is from the collector of transistor 52. The base of transistor 52, which is the inverting terminal 34 of operational amplifier 20, is connected to transistor 30.

A detailed explanation of the operation of the circuit shown in FIG. 3 is made below.

If emitter voltage $V_E$ of transistor 30 is higher than input $V_{in}$, the collector current of transistor 50 becomes smaller than the collector current of transistor 52. Having connected the collector of transistor 50 to the collector of transistor 46, which is one of the inputs of current mirror 40, current flowing out from the other input of current mirror 40, or the collector of transistor 48 is reduced. Due to the reduced collector current of transistor 48, the base current of transistor 30 is also reduced, and the emitter current $I_E$ and the emitter voltage $V_E$ of transistor 30 is then reduced until emitter voltage $V_E$ equals to input $V_{in}$.

Figure 5:
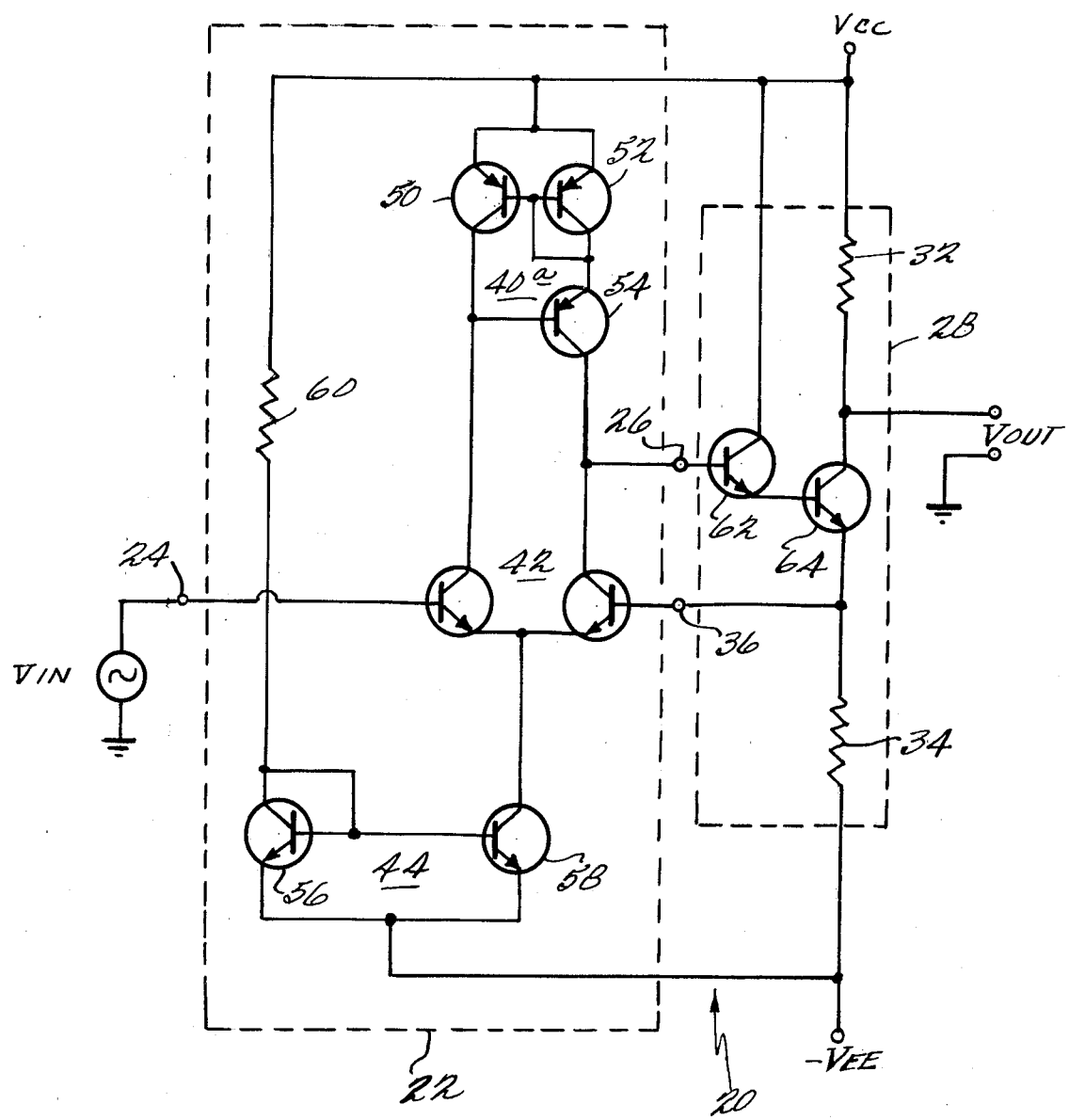
FIG. 5 shows an alternate embodiment of the present invention.

The inverse operation occurs when the emitter voltage $V_E$ of transistor 30 is lower than the input $V_{in}$. FIG. 5 shows a modification of the full wave rectifier of FIGS. 2 and 3.

Operatonal amplifier 22, in this embodiment, also consists of current mirror 40a, differential pair 42 and constant current source 44. Unlike the current mirror shown in FIG. 3, current mirror 40a in this embodiment has three transistors 50, 52 and 54, which is called a Willson source. Constant current source 44 consists of a current mirror including a pair of transistors 56 and 58 and a resistor 60 connected between the first power source $V_{CC}$ and the collector of transistor 56. Transistor circuit 28 includes transistors 62 and 64 for increased current gain.

Figure 6:
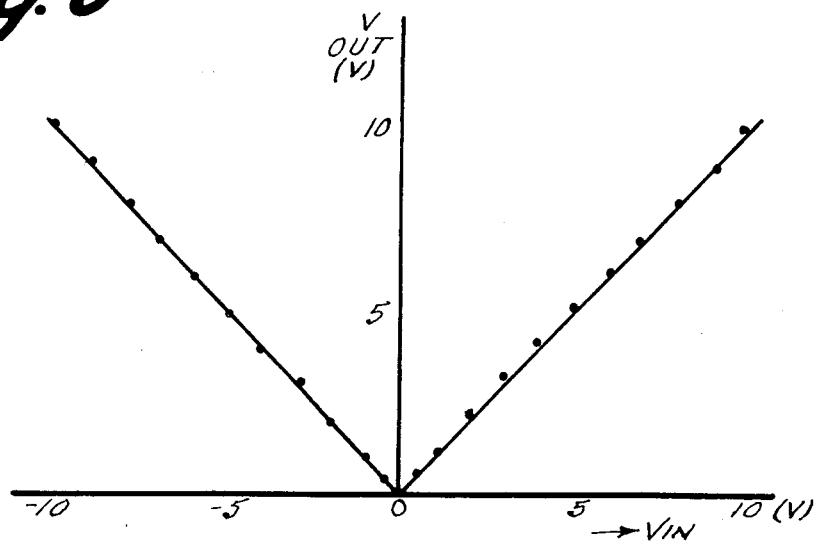
FIG. 6 shows the transfer of characteristics of the circuit shown in FIG. 5.

The operation of the circuit shown in FIG. 5 is almost the same as the circuit shown in FIG. 3, so that a detailed explanation is not necessary for one skilled in the art to make and use the invention. FIG. 6 illustrates the transfer characteristics of rectifier 20 shown in FIG. 5. It can be seen from FIGS. 7 and 8 that the deviation between the input $V_{in}$ and the output $V_{out}$ is significant when the input $V_{in}$ is positive. The deviation is almost 40 mV or 0.4 percent for negative input values, while the deviation is gradually reduced as the input increases positively from 100 mV. The deviation is expressed in the following equation:

$$\eta = (|V_{in}| - V_{out})/|V_{in}| \simeq 1 - \alpha \quad (9)$$

Figure 7:
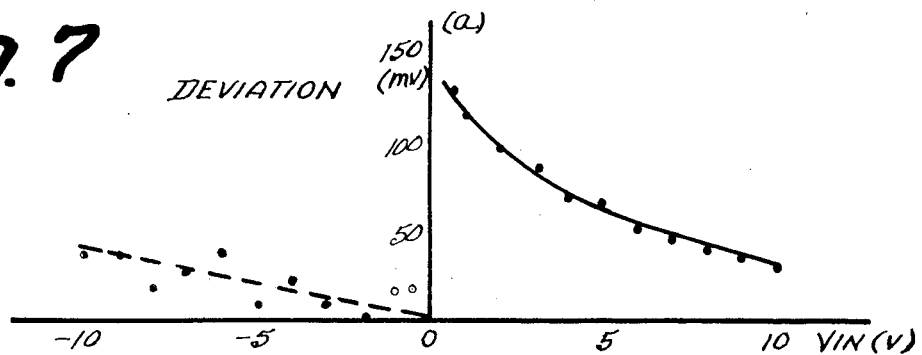
FIG. 7 shows the deviation characteristics of the circuit of FIG. 5 expressed as a voltage.
Figure 8:
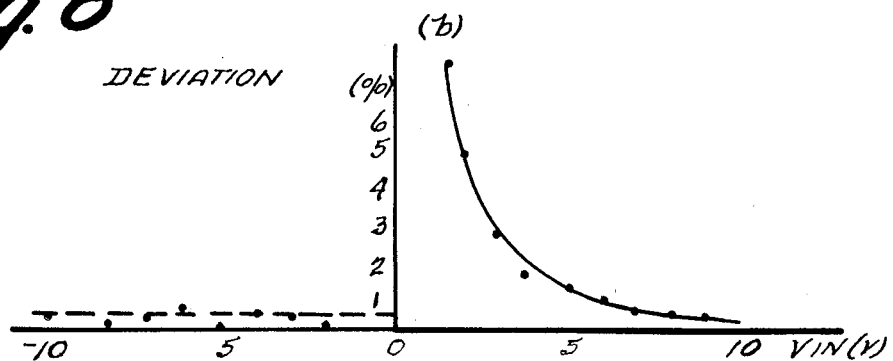
FIG. 8 shows the same deviation characteristics expressed as a percentage.

As the current amplification factor α is more than 0.99, deviation η calculated by equation (9) is the same as that illustrated in FIGS. 7 and 8 when the input is negative. The reason why the deviation is reduced by increasing the input is the fact that the saturated collector voltage of transistor 64 decreases when the collector current decreases (and the collector current decreases as the input voltage increases).

Although only a few exemplary embodiments of this invention have been described in detail above, these skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A full wave rectifier comprising:
   a transistor circuit including a first transistor having a control terminal and current conducting terminals and first and second resistors each having one terminal connected to one of said current conducting terminals, respectively and another terminal connected to first and second power sources, respectively;
   a current mirror having a power terminal connected to said first power source, an input terminal and an output terminal, said first transistor control terminal being connected to said output terminal;
   a second transistor having a base for receiving an alternating signal to be rectified, a first current conducting terminal connected to said current mirror input terminal and a second current conducting terminal;
   a third transistor having a base connected to one of said first transistor current conducting transistors, a first current conducting terminal connected to said current mirror output and a second current conducting terminal; and
   a constant current source connected to said second and third transistors second current conducting terminals.

2. A full wave rectifier comprising:
   a transistor circuit including a first transistor having a base and two current conducting terminals, a second transistor having a control terminal connected to one of said first transistor current conducting terminals and current conducting terminals and first and second resistors each having one terminal connected to one of said second transistor current conducting terminals, respectively and another terminal connected to first and second power sources, respectively;

a current mirror having a power terminal connected to said first power source, an input terminal and an output terminal;

a third transistor having a base connected to said current mirror input terminal, a first current conducting terminal connected to said current mirror output terminal and a second current conducting terminal connected to said first transistor base;

a fourth transistor having a base for receiving an alternating signal to be rectified, a first current conducting terminal connected to said current mirror input terminal and a second current conducting terminal;

a fifth transistor having a base connected to one of said second transistor current conducting transistors, a first current conducting terminal connected to said third transistor second current conducting terminal and a second current conducting terminal; and a constant current source connected to said fourth and fifth transistors second current conducting terminals.

3. A full wave rectifier as in claim 1 or 2 wherein said constant current source includes a current mirror.

* * * * *